United States Patent [19]

Ganse

[11] Patent Number: 5,293,247

[45] Date of Patent: Mar. 8, 1994

[54] DIGITAL DEMODULATOR WITH A UNIT FOR CORRECTING OVER MODULATION AND PREVENTING BLACK REVERSING

[75] Inventor: Shigeru Ganse, Kanagawa, Japan

[73] Assignee: Sony Corporation, Tokyo, Japan

[21] Appl. No.: 29,066

[22] Filed: Mar. 10, 1993

[30] Foreign Application Priority Data

Mar. 26, 1992 [JP] Japan .................................. 4-068546

[51] Int. Cl.$^5$ ................... H04N 9/79; H04N 5/91; H04N 5/213

[52] U.S. Cl. ...................... 358/328; 358/330; 358/340; 348/607

[58] Field of Search ............. 360/65, 29, 32, 46; 358/328, 23, 330, 323, 133, 335, 327, 340, 336, 36, 167

[56] References Cited

U.S. PATENT DOCUMENTS

| | | | |
|---|---|---|---|
| 4,677,497 | 6/1987 | Yoshinaka | 358/330 X |
| 4,692,801 | 9/1987 | Ninomiya et al. | 358/133 |
| 4,719,520 | 1/1988 | Isshiki | 358/330 X |
| 4,980,779 | 12/1990 | Sakata | 358/330 X |
| 5,032,925 | 7/1991 | Ganse et al. | 358/330 X |
| 5,063,452 | 11/1991 | Higurashi | 358/335 X |
| 5,067,009 | 12/1991 | Ganse | 358/12 |
| 5,113,262 | 5/1992 | Strullg et al. | 358/323 X |
| 5,130,811 | 7/1992 | Ganse | 358/330 |
| 5,136,392 | 8/1992 | Ganse | 358/330 |
| 5,142,376 | 8/1992 | Ogura | 358/327 X |

Primary Examiner—Donald Hajec
Assistant Examiner—Patrick Wamsley
Attorney, Agent, or Firm—Lewis H. Eslinger; Jay H. Maioli

[57] ABSTRACT

A digital demodulator includes a reproducing head for reproducing an analog video signal from a recording medium, an analog to digital converter for converting the analog video signal applied from the reproducing head into a digital signal, a Hilbert transform circuit for transforming the digital signal into signals whose phases are shifted by first and second angles from the digital signal, respectively, a frequency detector for detecting a frequency of the transformed signals, a first coefficient circuit for weighting an output signal of the frequency detector, a second coefficient circuit for weighting the transformed signals, a multiplier for multiplying output signals of the first and second coefficient circuits together, an equalizer for correcting a frequency characteristic of the transformed signals, and a demodulator for demodulating an output signal of the equalizer, wherein the frequency characteristic of the equalizer is corrected in accordance with an output of the multiplier.

5 Claims, 4 Drawing Sheets

DIGITAL DEMODULATOR WITH A UNIT FOR CORRECTING OVER MODULATION AND PREVENTING BLACK REVERSING

BACKGROUND OF THE INVENTION

1. Field of the Invention

The present invention generally relates to digital demodulators and, more particularly, is directed to a digital demodulator for a video tape recorder (VTR) having a correcting unit for correcting the frequency characteristic of an equalizer circuit thereof.

2. Description of the Prior Art

According to the conventional digital demodulator for a VTR, as shown in FIG. 1, a frequency modulated (FM) luminance signal reproduced by a reproducing head 1 is amplified by an amplifier 2 and then converted into a digital FM luminance signal by an analog to digital (A/D) converter 3.

The digital FM luminance signal is then converted into complex signals x and y which are phase shifted by 0° and 90° from the digital FM luminance signal by a Hilbert transform circuit 4, respectively.

FIG. 2 shows a simplified arrangement of the Hilbert transform circuit for shifting a phase of an input signal applied thereto by 90°. Referring to FIG. 2, delay circuits 31 and 32 are connected in series and an input signal is applied to an input terminal 33. The input signal is supplied to a multiplier 34 from the input terminal 33. Further, the input signal is supplied to a multiplier 35 from the input terminal 33 through the delay circuits 31 and 32. The multipliers 34 and 35 have coefficients of $\frac{1}{2}$ and $-\frac{1}{2}$, respectively. Outputs of the multipliers 34 and 35 are supplied to an adder 36, so that a signal whose phase is shifted by 90° from that of the input signal is obtained from an output terminal 37 which is output from the adder 36. On the other hand, a signal whose phase is shifted by 0° from that of the input signal is obtained from an output terminal 38 at the connection point between the delay circuits 31 and 32.

Turning back to FIG. 1, the complex signals x and yX are applied to an equalizer circuit 5 to which a coefficient K changing in accordance with a level of the luminance signal is applied. Further, the complex signals x and yX are applied to a signal level detector 6 for detecting a level of the luminance signal.

The signal level detector 6 calculates a square root of $(x^2+y^2)$ based on the complex signals x and y to thereby obtain a level of the luminance signal. An output signal of the signal level detector 6 representing the calculated level of the luminance signal is applied to a read only memory (ROM) 7, which in turn obtains a coefficient K based on a characteristic curve stored therein as shown by a solid line in FIG. 3 and then outputs the coefficient K to the equalizer circuit 5. In FIG. 3, the abscissa represents a signal level of the luminance signal and the ordinate represents a coefficient K. The equalizer circuit 5 changes its frequency characteristic in accordance with the coefficient K in a manner that the larger the coefficient K is, that is, the lower the detected level of the luminance signal is, a higher the frequency of the luminance signal boosted will be, so that an optimum demodulation is performed by a demodulator 8 at the next stage.

However, according to the thus constituted conventional digital demodulator, since the coefficient K is determined on the basis of only the characteristic shown by the solid line in FIG. 3, the higher frequency of the reproduced FM luminance signal is boosted when a level of the luminance signal is low even if a frequency of the luminance signal is in the vicinity of a frequency of a carrier signal. Thus, in the lower frequency converted chrominance subcarrier system, a sum frequency signal of the chrominance signal and the FM luminance signal which is generated as a cross modulation distortion of the chrominance signal and the FM luminance signal is detected as a luminance signal, so that there may occur such an over-modulation phenomenon that a black portion of an image becomes white. In particular, when the FM luminance signal is subjected to the amplitude modulation by the cross modulation, a level of the FM luminance signal may be erroneously judged to be very low and so the higher frequency thereof may be boosted. In this case, the above-described over-modulation may more likely occur.

FIG. 1 does not illustrate a separation circuit for separating the FM luminance signal and the lower frequency chrominance signal, but in general the extraction of the FM luminance signal may be performed by a filter for the luminance signal which may be provided at the rear stage of the amplifier 2, for example.

OBJECTS AND SUMMARY OF THE INVENTION

Therefore, it is an object of the present invention to provide an improved digital demodulator in which the aforementioned shortcomings and disadvantages encountered with the prior art can be eliminated.

More specifically, it is an object of the present invention to provide a digital demodulator in which, when a frequency of the reproduced FM luminance signal is in the vicinity of a frequency of the carrier signal, the sum frequency signal of the chrominance signal and the FM luminance signal which is generated as the cross modulation distortion of the chrominance signal and the FM luminance signal is not detected as a luminance signal, so that the over-modulation phenomenon does not occur and a spacing loss can be effectively corrected.

As an aspect of the present invention, there is provided a digital demodulator which includes a reproducing head for reproducing an analog video signal from a recording medium, an analog to digital converter for converting the analog video signal applied from the reproducing head into a digital signal, a Hilbert transform circuit for transforming the digital signal into signals whose phases are shifted by first and second angles from the digital signal, respectively, a frequency detector for detecting a frequency of the transformed signals, a first coefficient circuit for weighting an output signal of the frequency detector, a second coefficient circuit for weighting the transformed signals, a multiplier for multiplying output signals of the first and second coefficient circuits together, an equalizer for correcting a frequency characteristic of the transformed signals, and a demodulator for demodulating an output signal of the equalizer, wherein the frequency characteristic of the equalizer is corrected in accordance with an output of the multiplier.

According to the thus constituted digital demodulator of the present invention, since the frequency characteristic of the equalizer circuit is corrected based on the frequency of the FM luminance signal, when the frequency of the FM luminance signal is within the predetermined band width, an amount of the boost at the higher frequency of the transformed signals is decreased, so that the generation of the over-modulation is prevented and the spacing loss is corrected due to the decreased amount of the boost at the higher frequency.

The preceding and other objects, features, and advantages of the present invention will become apparent from the following detailed description of an illustrative embodiment thereof when read in conjunction with the accompanying drawings.

DETAILED DESCRIPTION OF THE PREFERRED EMBODIMENT

A digital demodulator for a VTR according to the embodiment will now be described with reference to FIGS. 4 and 5.

Figure 1:
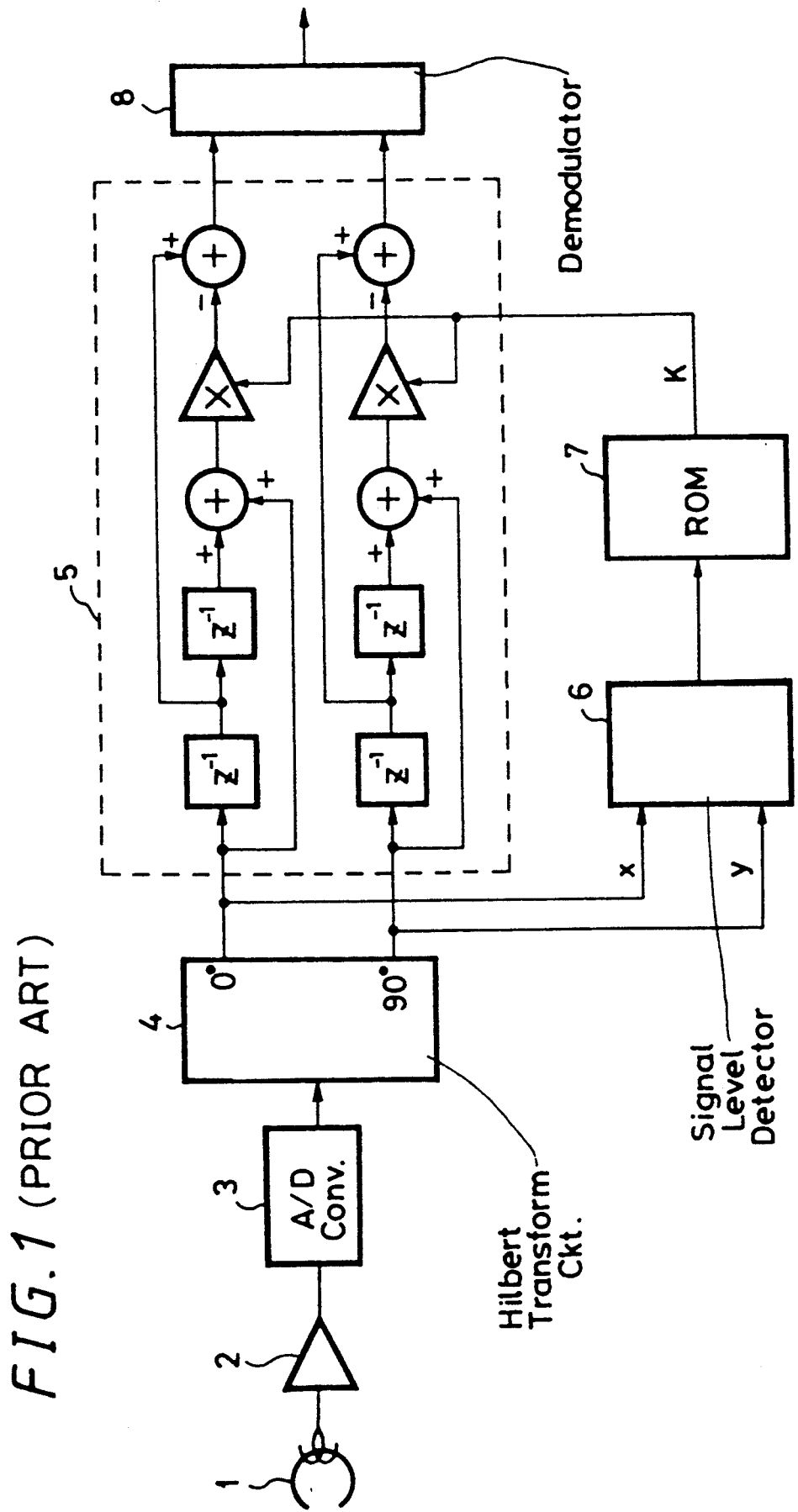
FIG. 1 shows in block diagram form an arrangement of a conventional digital demodulator for a VTR.
Figure 2:
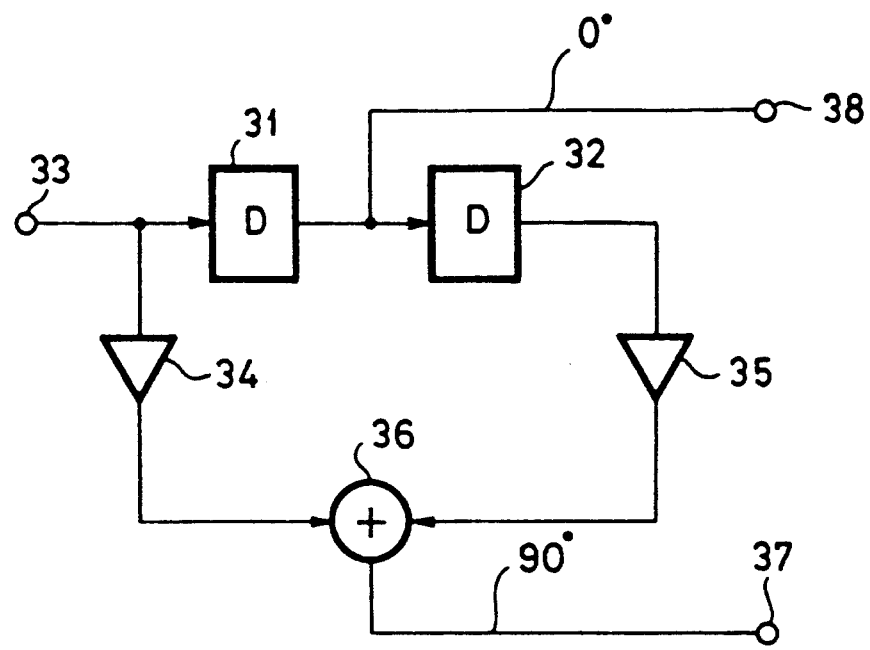
FIG. 2 shows in block diagram form an arrangement of a Hilbert transform circuit.
Figure 4:
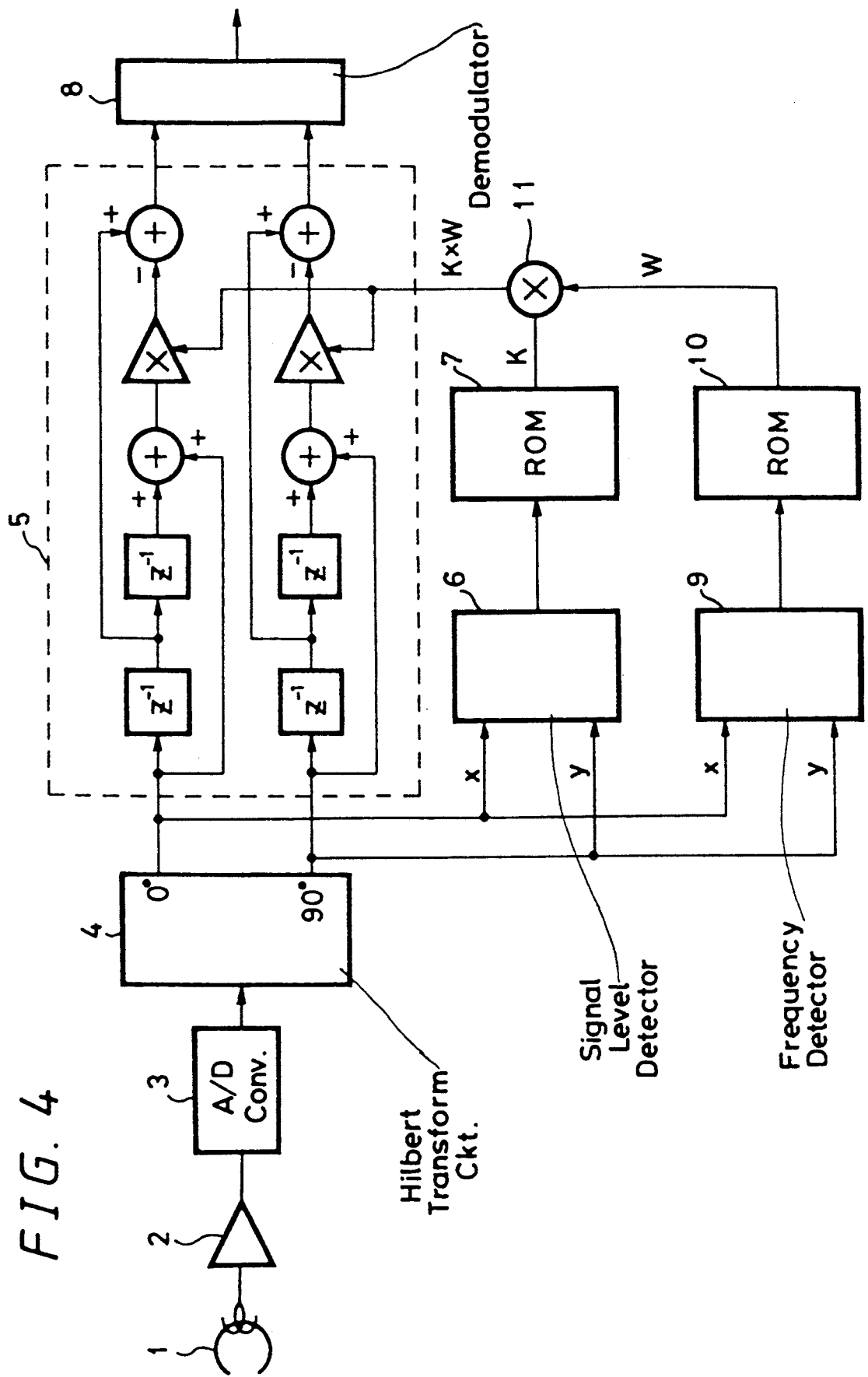
FIG. 4 shows in block diagram form an arrangement of a digital demodulator according to an embodiment of the present invention.

FIG. 4 shows in block diagram form an arrangement of the embodiment of the present invention. In FIG. 4, portions identical to those of FIG. 1 are referred to by the common symbols, with explanation thereof being omitted. The digital demodulator of the embodiment shown in FIG. 4 differs in construction from the conventional digital demodulator shown in FIG. 1 in the following points. That is, as shown in FIG. 4, a frequency detector 9 detects a frequency of the reproduced FM luminance signal from the Hilbert transform circuit 4 and applies its output signal representing the detected frequency to a coefficient circuit or ROM (ROM table) 10, which in turn outputs a weight coefficient W depending on the detected frequency. Then, a multiplier 11 multiplies the coefficient K output from the coefficient circuit or ROM (ROM table) 7 and the coefficient W outputted from the ROM 11 together. A correcting unit is constituted by the frequency detector 9, ROM 10 and multiplier 11.

The signal level detector 6 outputs a signal representing a level of the luminance signal (hereinafter referred to as a level signal), like the detector 6 in FIG. 1, and then applies the level signal to the ROM 7. The frequency detector 9 receives the complex signals x and y output from the Hilbert transform circuit 4, obtains an angle of the FM luminance signal from arc tan (y/x) and then differentiates the obtained angle by time to obtain an angular velocity, that is, a frequency of the FM luminance signal. The frequency detector outputs a signal representing the detected frequency (hereinafter referred to as a frequency signal) to the ROM 10.

Figure 5:
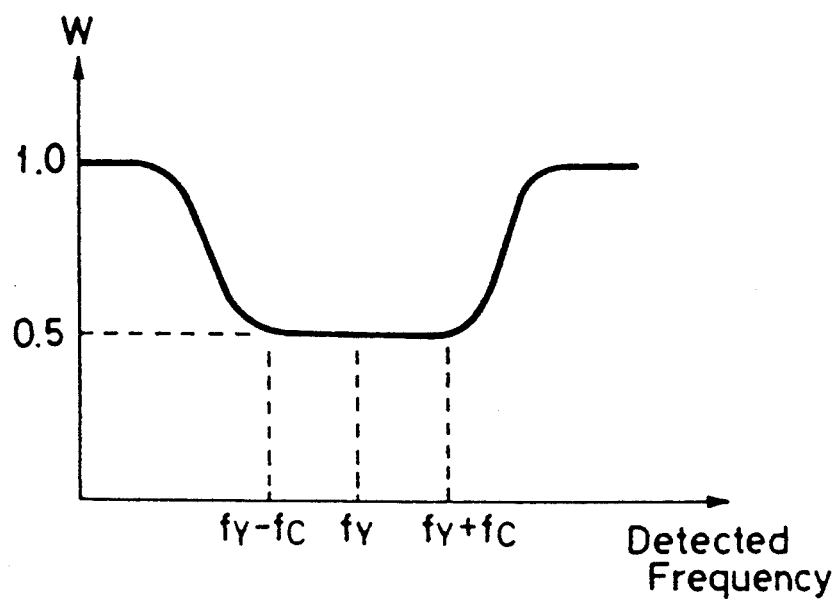
FIG. 5 shows a detected frequency-weight coefficient characteristic of a ROM of the digital demodulator according to the embodiment of the present invention.

The ROM 10 stores the detected frequency-weight coefficient characteristic shown in FIG. 5 and outputs a weight coefficient W corresponding to a detected frequency represented by the frequency signal to the multiplier 11. As shown in FIG. 5, since the sum frequency is (fY+fc), where fc is the frequency of the chrominance signal and fY is the frequency of the FM luminance signal, a band width, that is, a predetermined band width, of the detected frequency whose weight coefficient W becomes 0.5 is required to be not less than fc at the higher frequency side. When the sum frequency signal having the sum frequency of (fY+2 fc) is generated by the cross modulation distortion, the predetermined band width is required to be not less than 2 fc at the higher frequency side.

Figure 3:
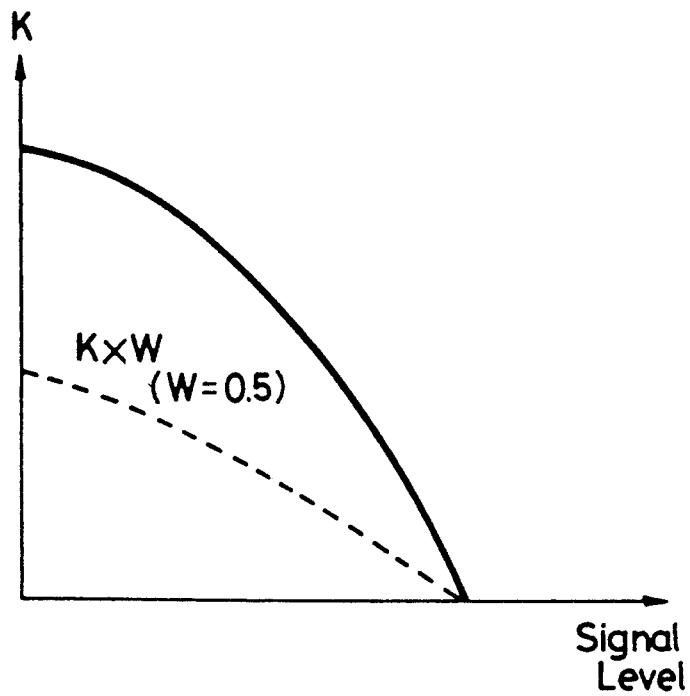
FIG. 3 shows a coefficient-signal level characteristic of a ROM of the conventional digital demodulator.

The multiplier 11 multiplies the input coefficients K and W together to output a value K×W. Since the frequency fY of the FM luminance signal is in the vicinity of the carrier frequency, the output value K×W of the multiplier 11 will be as shown by a dotted line in FIG. 3 when the weight coefficient W is 0.5

The output value K×W of the multiplier 11 is applied to the equalizer circuit 5. In the equalizer circuit 5, when the frequency of the FM luminance signal is within the above-mentioned predetermined band width, an amount of the boost at the higher frequency of the complex signals is decreased as shown by the dotted line in FIG. 3. Thus, a level of the sum frequency signal of the chrominance signal and the FM luminance signal which is generated as the cross modulation distortion is suppressed, so that the generation of the over-modulation is prevented and the spacing loss can be corrected due to the decreased amount of the boost at the higher frequency.

The inventor of the present invention has noticed that the luminance signal can be demodulated correctly even if an amount of the boost at the higher frequency is low as long as the frequency of the FM luminance signal is within the above-mentioned predetermined band width. In view of this notice, in this embodiment, the over-modulation due to the sum frequency signal is prevented by decreasing an amount of the boost at the higher frequency when the frequency of the FM luminance signal is within the above predetermined band width.

While, in the above-described embodiment, the explanation has been made in a case that the frequency of the FM luminance signal is within the above predetermined band width, when the frequency of the FM luminance signal is outside the expected range, the frequency may be judged to be abnormal and the luminance signal having the frequency out of the expected range may be removed.

As set out above, according to the digital demodulator of the present invention, since the frequency characteristic of the equalizer circuit is corrected on the basis of the frequency of the FM luminance signal, when the frequency of the FM luminance signal is within the predetermined band width, an amount of the boost at the higher frequency of the complex signals is decreased, so that the generation of the over-modulation can be prevented and the spacing loss can also be corrected due to the decreased amount of the boost at the higher frequency.

Having described the preferred embodiment of the invention with reference to the accompanying drawings, it is to be understood that the invention is not limited to that precise embodiment and that various changes and modifications could be effected therein by one skilled in the art without departing from the spirit or scope of the invention as defined in the appended claims.

What is claimed is:
1. A digital demodulator comprising:
   a reproducing head for reproducing an analog video signal from a recording medium;

an analog to digital converter for converting the analog video signal from said reproducing head into a digital signal;

a Hilbert transform circuit for transforming the digital signal into transformed signals whose phases are shifted by first and second angles from a phase of the digital signal, respectively;

a frequency detector for detecting a frequency of the transformed signals;

first coefficient calculation means for producing a weighting coefficient from an output signal of said frequency detector;

second coefficient calculation means for producing a weighting coefficient from the transformed signals;

a multiplier for multiplying together the weighting coefficients from said first and second coefficient calculation means and producing a correction signal;

an equalizer receiving said correction signal and said transformed signals for correcting a frequency characteristic of the transformed signals in response to said correction signal; and a demodulator for demodulating an output signal of said equalizer, wherein the frequency characteristic of said equalizer is corrected in accordance with said correction signal from said multiplier.

2. A digital demodulator according of claim 1, wherein each of said first and second coefficient calculation means comprises a read only memory table.

3. A digital demodulator according to claim 1, wherein said Hilbert transform circuit transforms the digital signal into complex signals and said first and second angles are 0° and 90°, respectively.

4. A digital demodulator according to claim 3, wherein said equalizer is formed of a plurality of delay circuits, adders and amplifiers.

5. A digital demodulator according to claim 4, wherein said equalizer makes both a higher frequency band and a lower frequency band of the reproduced video signal substantially half of an intermediate frequency band.

* * * * *